US005400407A

United States Patent [19]

Cassity et al.

[11] Patent Number: 5,400,407

[45] Date of Patent: Mar. 21, 1995

[54] TILT ADJUSTER FOR A SPEAKER SUPPORT FRAME

[75] Inventors: Terry A. Cassity, Paris; Bill R. Unseld; Thomas P. Carrin, both of Lexington, all of Ky.

[73] Assignee: Square D Company, Palatine, Ill.

[21] Appl. No.: 817,908

[22] Filed: Jan. 8, 1992

[51] Int. Cl.$^{6}$ ........................ H04R 25/00; H05K 5/00

[52] U.S. Cl. ........................ 381/87; 381/188; 381/205; 181/150

[58] Field of Search ................... 381/87, 205, 24, 188; 181/150

[56] References Cited

U.S. PATENT DOCUMENTS 4,166,933 9/1979 Cinquino ............................ 381/205

*Primary Examiner*—Curtis Kuntz
*Assistant Examiner*—Sinh Tran
*Attorney, Agent, or Firm*—Larry I. Golden; Kareem M. Irfan

[57] ABSTRACT

This invention provides for a tilt adjuster for a speaker support frame to adjust the tilt or position of a speaker which has been recessed mounted in a wall or the like. The tilt adjuster includes a wedge-shaped, one-piece adaptor frame body which attaches to a speaker on the front side and attaches to a speaker support frame structure on the back side. The frame structure is mounted on the wall. The tilt adjuster is preferably assembled with a speaker cover.

5 Claims, 1 Drawing Sheet

TILT ADJUSTER FOR A SPEAKER SUPPORT FRAME

RELATED APPLICATION

Related co-pending U.S. application Ser. No. 07/817,899 filed on even date herewith and identified by Assignee's Docket No. DL-58 (U.S. Pat. No. 5,331,119) discloses one class of speaker support frame structure which is suitable for use in combination with Tilt Adjuster For A Speaker Support Frame of the present invention. The entire teaching and disclosure of that co-pending application is incorporated hereinto by reference.

FIELD OF THE INVENTION

This invention relates to a tilt adjuster for a speaker support frame to adjust the tilt or position of a speaker which has been recessed mounted in a wall or the like.

BACKGROUND OF THE INVENTION

With the advent of improved consumer electronic equipment featuring high audio quality either singularly or in combination with video reproduction, the need arises to maximize the quality of any audio output equipment. One example is the home theater systems which combine a large screen television with multiple speakers located throughout the room to more realistically reproduce the sound surrounding the video images. Another example is the coupling of multiple speakers located throughout the entire home or like structure to a stereo receiver to provide background music regardless of a person's location in the home.

The position of the listener to the speaker is critical in determining the quality of the sound reproduction perceived by the listener. This is in conflict with the practical limitations that arise in placing speakers throughout the home. Often it is not possible to mount a speaker in a wall at the desired height or distance for the best perceived audio reproduction. The studs or other structures supporting the wall may prohibit the mounting of a speaker in the best location.

Speaker wall mounting assemblies in the prior art, such as Friedman Fr. Pat. No. 2,520,181 and Koshimura U.S. Pat. No. 4,860,369 fail to disclose any means for adjusting the position of the speaker within the assembly to correspondingly adjust the audio output into the room.

The art needs a new and improved tilt adjuster for a speaker support frame which adjusts the direction of the audio output from the speaker, particularly, if the speaker is recessed in a wall mounting configuration. Preferably, the frame structure allows versatility in the direction which the audio output from the speaker can be directed. The frame structure should also provide stable support for the speaker so as not to degrade the quality of the audio output from vibration. The present invention provides such an improved tilt adjuster for a speaker support frame to correspondingly adjust the direction of the audio output from an associated speaker.

SUMMARY OF THE INVENTION

This invention provides a new and improved tilt adjuster for a speaker support frame which provides adjustment to the direction of the audio output from a speaker. Particularly, if the speaker is used for a recessed wall mounting.

The tilt adjuster includes a one-piece unitary molded adaptor frame body having a front side and a back side. The adaptor frame body has an open central region for receiving therethrough body portion of the speaker housing. The front side includes a flattened perimeter region extending about the open central and is adapted for making abutting engagement with the speaker housing. The front side also includes a plurality of orifice means that are individually located adjacent to the perimeter region within the open central region.

The back side of the adaptor frame body includes a flattened perimeter region extending about the open central region and is adapted for making abutting engagement with a wall board. The back side includes a plurality of orifice means that individually located adjacent to the back side perimeter region within the open central region. The back side orifice means allows attachment of the adaptor frame body to a speaker support frame. The speaker support frame is attached to the speaker housing itself. Additionally, the speaker support frame is also attached to the wall board in the desired position within the room.

The front side orifice means is attached to the speaker housing itself. This allows tilting of the speaker housing out of the plane that the wall board is in.

The adaptor frame body preferably is wedge-shaped wherein the front side perimeter region is separated from the back side perimeter region by a distance greater at one end of the adaptor frame body than the opposed end.

The frame assembly of the present invention preferably includes a speaker cover. The speaker cover provides a means for disengagingly attaching itself to the adaptor frame body. Preferably the speaker cover has a grill-like central portion which substantially covers the speaker housing. The assembly also includes a speaker support frame structure and a speaker attached to the adaptor frame body.

Other and further objects, names, features, advantages, purposes, embodiments, variations and the like will be apparent to those skilled in the art from the teachings of the present specification taken with the accompanying drawings and the appended claims.

DETAILED DESCRIPTION

Figure 1:
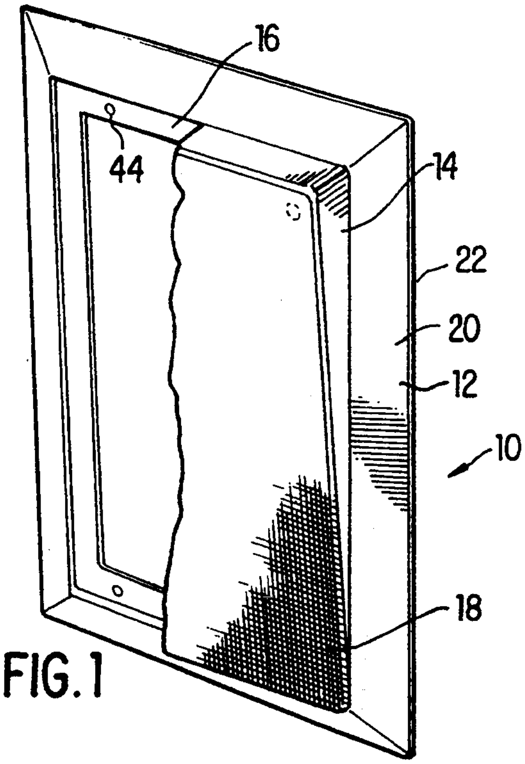
FIG. 1 is a front perspective view of one embodiment of a speaker support frame structure of the present invention which is shown in assembled combination with a speaker cover and a speaker support frame structure.

Referring to the drawings, there is seen in FIGS. 1–6 an embodiment 10 of a speaker frame assembly of the present invention. The assembly 10 includes a wall mounted support frame 12, an adaptor body 14, a speaker housing 16 and a speaker cover 18. The wall mounted support frame 12 is affixed to a wall board (not shown) in a region thereof that is laterally adjacent to an aperture that is preformed in the wall board. The aperture is adapted to receive therethrough body portions of the speaker housing 16.

The wall mounted support frame 12 has a flattened perimeter region which extends about a central aperture region. The perimeter region has an outer face that is adapted to make abutting engagement with the back side of the adaptor body 14. The perimeter region has a shoulder that stands peripherally about and preferably in laterally adjacent relationship to the aperture in the wall board. The wall mounted support frame 12 has an outwardly turned, flattened collar region 20 that extent peripherally about the shoulder region. The collar region has a peripheral outer edge 22 which is angled backwardly and is adapted to make contact with the exterior side portion of the wall board in laterally spaced relationship to the aperture in the wall board.

The perimeter configuration of the peripheral outer edge 22 can be as desired, including the rectangular configuration illustratively shown for embodiment 10, or otherwise such as a square or circular configuration. The configuration of the outer portion 22 need not be related to the configuration of the given speaker or to the shape of a given aperture in the wall board, as those skilled in the art will readily appreciate. Preferably, the size of the aperture in the wall is slightly greater than the size of the shoulder of the wall mounted support frame 12 so that the support frame 12 is generally loosely accommodated by the aperture in the wall board.

The speaker support frame structure 10 incorporates a one-piece, unitary, molded, adaptor frame body 14 which is preferably comprised of plastic and which has a front side 24 and a back side 26. The adaptor frame body 14 also has an open central region or aperture 28 which is adapted to receive therethrough body portions of the speaker housing 16. The body portions include the portion 30 which houses the speaker magnet and the portion 32 which houses a conically tapered speaker cone. The speaker housing 16 further includes an outwardly turned frontal flange 34 that is used for mounting the speaker.

As those skilled in art will appreciate, a speaker support frame structure 10 can be adapted and configured for usage with a wide variety of different speaker structures. Although a speaker with a cross-sectional rectangular shape (proceeding rearwardly from the frontal flange) is illustratively shown, other speaker shapes can be utilized in a single speaker assembly can involve more than one speaker cone. For example, a single speaker assembly can involve two or more associated speakers, each one of which is adapted to reproduce sound over a particular predetermined frequency range (not illustrated). Thus, instead of a rectangular configuration illustrated in FIGS. 1–6, the open central region 28 can have another configuration which is particularly well adapted for receipt therethrough of a particular speaker assembly, such as a square or a circular perimeter configuration.

Figure 3:
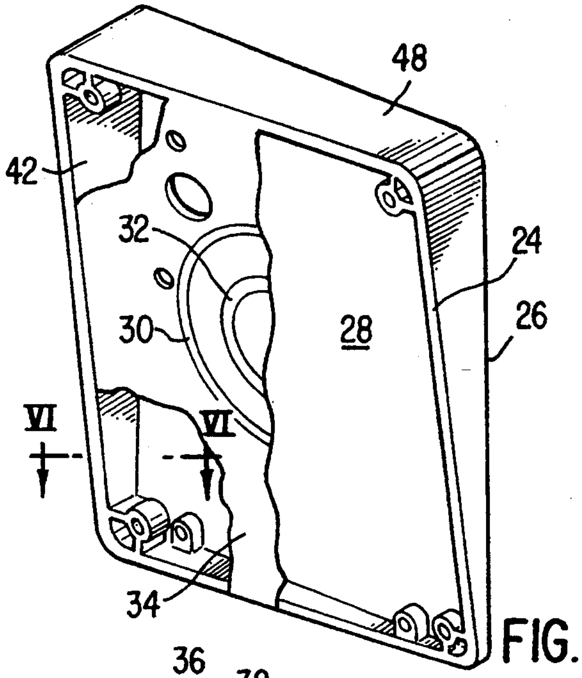
FIG. 3 is a perspective view of the adaptor frame body from the embodiment shown in FIG. 1 further including a speaker attached to the front side thereof.
Figure 4:
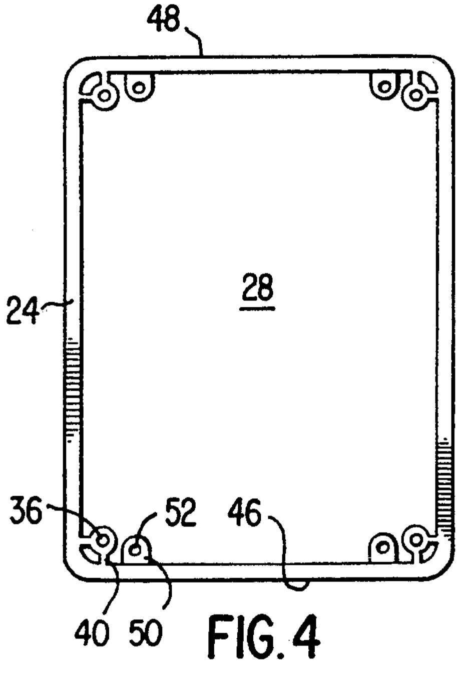
FIG. 4 is a back side elevational view of the embodiment shown in FIG. 3.
Figure 6:
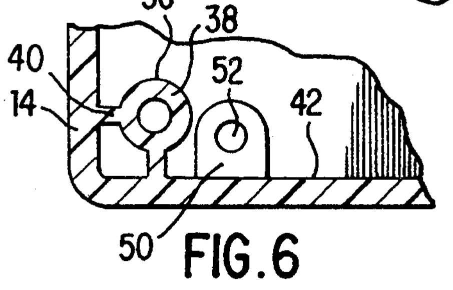
FIG. 6 is an enlarged fragmentary cross-sectional view along the line VI—VI of FIG. 3 illustrating a corner of the embodiment shown therein.
Figure 5:
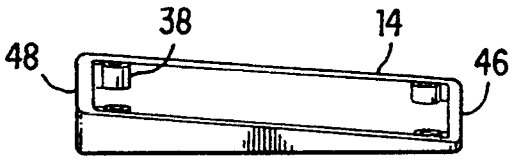
FIG. 5 is a side perspective view of the embodiment shown in FIG. 3.

Referring to FIGS. 3 and 4, the front side 24 of the adaptor frame body 14 is defined by a flattened perimeter region extending about the open central region 28. The front side 24 is adapted for making abutting engagement with the speaker housing 16. To disengagingly attach the adaptor-frame body 14 to the speaker housing 16, the front side has a plurality of orifices wherein each orifice is defined by a cylinder 38. Each cylinder extends at least partially across the depth of the adaptor frame body 14. Each cylinder has several reinforcing ribs 40 which connect the cylinder 38 to the interior sidewall 42 of the adaptor frame body 14.

In the assembled configuration, each cylinder 38 is positioned so that its orifice is in aligned relationship with an orifice 44 defined in the speaker flange 34. Any conventional fastener such as a screw (not shown) is extended through each orifice 44 on the speaker flange 34 to threadingly engage the orifice 36 on the cylinder 38 of the adaptor frame body 14. Making the connection between the front side 24 and the speaker flange 34, results in tilting the speaker housing 16 out of the plain wall mounted support frame 12 into the plain of the front side 24. This advantageously allows directing of the audio output of the speaker housing 16 to a position not perpendicular to the wall board.

Figure 2:
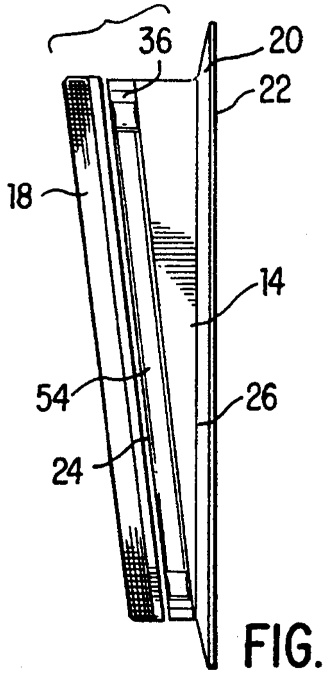
FIG. 2 is a side elevational view of the embodiment shown in FIG. 1 with the speaker cover detached from the speaker support frame structure.

As illustrated in FIGS. 2 and 3, preferred side configuration of the adaptor frame body 14 is wedge-shaped. Accordingly, the front side 24 is separated from the back side 26 a greater distance at one end 46 of the adaptor frame body 14 than the opposed end 48.

The back side of the adaptor frame body 14 includes a plurality of tabs 50 which extend from the interior side wall 42 within the open central region 28. Each tab 50 extends partially across the depth of the adaptor frame body 14. Within each tab 50, a hole 52 is defined.

In the assembled configuration, each tab 50 is position so that its hole 52 is in a lined relationship with a corresponding hole (not shown) in the perimeter region of the wall mounted support frame 12. Any conventional fastener means such as a screw can then be used to attach the adaptor frame body 14 to the wall mounted support frame 12.

The speaker support frame structure also includes a speaker cover. Preferably, the speaker cover is made of a malleable metal such as stainless steel or a cloth-like material which can be stretched over the exterior sidewall where the speaker flange 34 is attached to the front side 24 of the adaptor frame body 14. The present invention contemplates other materials that are suitable for allowing the acoustical vibrations from the speaker housing 16 to pass through the material sufficiently. If is also desirable if the material can bend or wrap around the side edge 54 to attach the speaker cover 18 to the frame structure 10.

Although the invention has been described in reference to particular embodiments in applications, the invention is susceptible to other applications which will be apparent to those skilled in the art.

We claim:

1. A tilt adjuster for a speaker support frame structure for association with a preformed aperture in a wall board and for recessed mounting of a speaker housing, the tilt adjuster comprising:

a one-piece, unitary, molded adaptor frame body having a front side and a back side respectively adapted for positioning farthest and nearest to the wall board, the adaptor frame body having an open central region for receiving therethrough body portions of the speaker housing, the front side having a flattened perimeter region extending about the open central region and adapted for making abutting engagement with the speaker housing and for positioning body portions of the speaker housing within the open central region, the front side having a plurality of orifice means that are individually located adjacent to the perimeter region within the open central region, so that the front sides of the orifice means are exposed for attachment to the speaker housing independent of the attachment of the back side, the back side having a flattened perimeter region extending about the open central region and adapted for making abutting engagement with the exterior side of the wall board, the back side having a plurality of orifice means that are individually located adjacent the back side perimeter region in the open central region, the adaptor frame body having a wedge-shape wherein the front side perimeter region is separated from the back side perimeter region a greater distance on one end of the adaptor frame body than the opposed side.

2. A speaker support frame assembly for association with a preformed aperture in a wall board and for recessed mounting of a speaker housing, the assembly comprising:

a wall-mounted support frame having an aperture for receiving therethrough body portions of the speaker, the wall mounted support frame having a flattened perimeter region extending about the aperture, the perimeter region having a front side adapted for making abutting engagement with the back side of an adaptor frame body; and a one-piece, unitary, molded adaptor frame body having a front side and a back side, the adaptor frame body having an open central region for receiving therethrough body portions of the speaker housing, the front side having a flattened perimeter region extending about the open central region and adapted for making abutting engagement with the speaker housing, the front side having a plurality of orifice means that are individually located adjacent to the perimeter region within the open central region, the back side having a flattened perimeter region extending about the open central region and adapted for making abutting engagement with the front side of the support frame perimeter region [wall board], the back side having a plurality of orifice means that are individually located adjacent the back side perimeter region in the open central region, the adaptor frame body having a wedge-shape wherein the front side perimeter region is separated from the back side perimeter region a greater distance on one end of the adaptor frame body than the opposed side.

3. A speaker support frame assembly for association with a preformed aperture in a wall board and for recessed mounting of a speaker housing, the assembly comprising:

a wall mounted support frame having an aperture for receiving therethrough body portions of the speaker housing, the wall mounted support frame having a flattened perimeter region extending about the aperture and adapted for making abutting engagement with the back side of an adaptor frame body, the wall mounted support frame having a shoulder upstanding frontally from and extending peripherally about the perimeter region, the shoulder region being adjacent to the preformed aperture in the wall board, the wall mounted support frame having an outwardly turned region extending peripherally about the shoulder region, a collar adjusted for contacting the exterior side of the wall board adjacent the preformed aperture; and a one-piece, unitary, molded adaptor frame body having a front side and a back side, the adaptor frame body having an open central region for receiving therethrough body portions of the speaker housing, the front side having a flattened perimeter region extending about the open central region and adapted for making abutting engagement with the speaker housing, the front side having a plurality of orifice means that are individually located adjacent to the perimeter region within the open central region, the back side having a flattened perimeter region extending about the open central region and adapted for making abutting engagement with the wall board, the back side having a plurality of orifice means that are individually located adjacent the back side perimeter region in the open central region, the adaptor frame body having a wedge-shape wherein the front side perimeter region is separated from the back side perimeter region a greater distance on one end of the adaptor frame body than the opposed side.

4. The frame assembly of claim 2 wherein the frame structure further includes a speaker cover which substantially covers the speaker housing, the speaker covers attaches to the front side of the adaptor frame body.

5. The frame assembly of claim 2 wherein the frame structure further includes a speaker attached to the front side of the adaptor frame body.

* * * * *